United States Patent [19]
Furutani et al.

[11] Patent Number: 4,873,669
[45] Date of Patent: Oct. 10, 1989

[54] RANDOM ACCESS MEMORY DEVICE OPERABLE IN A NORMAL MODE AND IN A TEST MODE

[75] Inventors: Kiyohiro Furutani; Koichiro Mashiko; Kazutami Arimoto; Noriaki Matsumoto; Yoshio Matsuda, all of Itami, Japan

[73] Assignee: Mitsubishi Denki Kabushiki Kaisha, Tokyo, Japan

[21] Appl. No.: 77,306

[22] Filed: Jul. 24, 1987

[30] Foreign Application Priority Data

Jul. 30, 1986 [JP] Japan ................................ 61-179741

[51] Int. Cl.$^4$ ........................ G11C 7/00; G11C 11/40
[52] U.S. Cl. .............................. 365/189.01; 365/201; 365/230.03; 365/189.04
[58] Field of Search ...................... 365/189, 201, 230; 371/21

[56] References Cited

U.S. PATENT DOCUMENTS

| | | | |
|---|---|---|---|
| 4,464,750 | 8/1984 | Tatematsu ........................ | 365/201 X |
| 4,672,582 | 6/1987 | Nishimuru et al. ................ | 365/201 |
| 4,742,486 | 5/1988 | Takemae ......................... | 365/207 X |
| 4,744,061 | 5/1988 | Takemae et al. .................. | 365/201 |

OTHER PUBLICATIONS

"A Reliable 1-M bit DRAM with a Multi-Bit-Test Mode", Kumanoya, et al., IEEE Journal of Solid-State Circuits, vol. SC-20, No. 5, Oct., 1985, pp. 909-913.

Primary Examiner—Stuart N. Hecker
Assistant Examiner—Alyssa H. Bowler
Attorney, Agent, or Firm—Saidman, Sterne, Kessler & Goldstein

[57] ABSTRACT

A semiconductor memory device operable for reading and writing in a normal mode and in a test mode is divided into memory cell sections each having blocks of memory cells. Data bus lines are connected to the respective blocks, and switches interconnect data bus lines connected to blocks of the different sections. The switches are made conductive during reading and writing in the normal mode and during writing in the test mode, and nonconductive during reading in the test mode. Input data are applied onto the data bus lines connected to one of the blocks for writing in the blocks of the sections simultaneously during writing in the normal mode and in the test mode. In the normal mode, data are read out of the blocks of the sections through the data bus lines connected to the above-mentioned one of the blocks. In the test mode, the data are read out of the blocks of the sections through the data bus lines connected to the respective blocks.

9 Claims, 4 Drawing Sheets

RANDOM ACCESS MEMORY DEVICE OPERABLE IN A NORMAL MODE AND IN A TEST MODE

BACKGROUND OF THE INVENTION

The present invention relates to a MOS random access memory (RAM), and particularly to an improvement in the configuration of data bus lines of a large capacity MOSRAM.

FIG. 1 shows a configuration of data bus lines of a conventional MOS dynamic RAM. In recent years, the capacity of MOS dynamic RAMs is increasing. With that, the time required for testing a RAM is increasing and being more problematical. Various schemes have been proposed to reduce the test time. For instance, in the *ISSCC Digest Technical Papers* (1985); p. 240; M. Kumanoya et al., it is proposed to treat a 1-M bit DRAM of a $\times 1$ configuration as a memory of $\times 4$ configuration during test mode. With the $\times 4$ configuration for the test mode the memory cell array are divided into four blocks, and part (two bits) of the address code are used to select one of the four blocks while the rest of the address code is used to select one of the memory cells in each block. When for instance reading data by application of an address code, four bits of data are read out of the corresponding memory cells (addressed by the above-mentioned "rest of the address code") of the four blocks onto four pairs of I/O lines and only one of switches connected to the I/O lines are made conductive by the above-mentioned "part of the address code", so that only one of the four bits are output from the memory cell array.

FIG. 1 shows a MOS DRAM of a $\times 1$ configuration having a test mode function of a $\times 4$ configuration. In the figure, the MOS DRAM comprises a memory cell array 1, four preamplifiers 2 for detecting and amplifying data on four pairs of complementary data I/O lines 7 read out of the memory cell array 1, a mode controller 3 for switching between a normal mode and a test mode, a test controller 4 for providing signals for the test mode operation, a block selector 5 for secting one of the four outputs (data) read out during the normal mode and a buffer 6 in the form of an exclusive-OR gate receiving the four outputs (data) during the test mode and outputting test data.

During the normal mode operation, the mode controller 3 is kept in the normal mode under control of the test controller 4. In this state, data are read out of the memory cell array 1 onto the four pairs of complementary I/O lines 7, and are detected and amplified by the preamplifiers 2. The four data are then read out by the block selector 5 and one of the four data corresponding to the address then being supplied is output. If the memory cell array 1 consists of N memory cells or N bits, the time required for reading all the bits is (cycle time tc) $\times N = N \cdot tc$ During the test mode operation, the four data are similarly supplied via the I/O lines 7 to and amplified at the preamplifiers 2. The test controller 4 then provides a test control signal, upon which the mode controller 3 operates in the test mode. The four data are then supplied to the exclusive-OR buffer 6, and the test result is output. The time required for reading all the bits is $N \cdot tc / 4$ Writing data is achieved by inputing data via the Din terminal, the block selector 5, the mode controller 3 and the pairs of the I/O lines 7. In the normal mode, the data is supplied to the memory cell array 1 through one of the pairs of the I/O lines 7. In the test mode, the same data are supplied to the memory cell array 1 through the four pairs of the I/O lines 7 to the four bits (four memory cells). Thus, the time required for writing in the test mode is ¼ of the time required for writing in the normal mode.

The concept of using the $\times 4$ configuration in the test mode can be hypothetically extended to a $\times 8$ configuration, a $\times 16$ configuration, etc. to cope with further increase in the capacity of memories. But this leads to increase in the number of the I/O lines disposed in parallel with each other on the chip surface, e.g., 8 pairs, 16 pairs, etc., and increased complexity of the bus line configuration and increased chip surface area.

SUMMARY OF THE INVENTION

An object of the invention is to improve test mode functions, without increasing the number of I/O lines disposed in parallel with each other.

Another object of the invention is to reduce the test time without increasing the complexity of the bus line configuration.

According to the invention, there is provided a memory device operable for reading and writing in a normal mode and in a test mode, comprising, memory cell sections each having blocks of memory cells, data bus lines connected to the respective blocks, switch means for interconnecting data bus lines connected to blocks of the different sections, switch control means for causing the switch means to be conductive during reading and writing in the normal mode and during writing in the test mode, and causing the switch means to be nonconductive during reading in the test mode, means connected to the data bus lines that are connected to the blocks of one of the sections for applying input data onto the data bus lines for writing in the blocks of the sections simultaneously during writing in the normal mode and in the test mode, and for outputting the data read out of the blocks of the sections during reading in the normal mode, and for outputting the data read out of the blocks of said one of the sections during reading in the test mode, and means connected to the data bus lines that are connected to the blocks of the section or sections other than said one of the sections, for outputting the data read output of the memory cell blocks of said other section or sections during reading in the test mode.

DETAILED DESCRIPTION OF THE PREFERRED EMBODIMENTS

Figure 1:
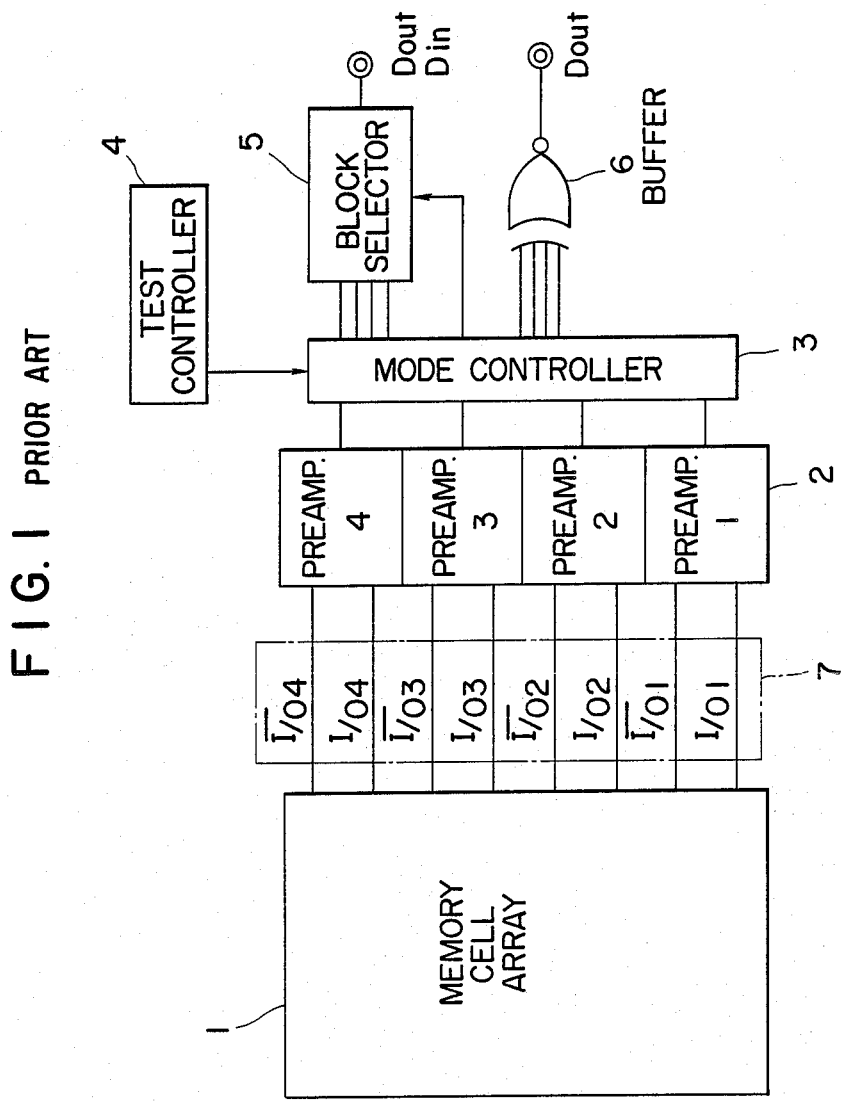
FIG. 1 is a block diagram showing a prior art random access memory.

An embodiment of the invention will be described with reference to FIG. 2. In FIG. 2, the members or elements bearing the reference numerals identical to those in FIG. 1 have identical or similar functions. The memory cell array is divided into two sections 8 and 9. Connected to the first section 8 are four pairs of complementary I/O lines 14. Connected to second section 9 are four pairs of complementary I/O lines 15. The I/O lines 14 and 15 are interconnected by I/O switches 13. The layout of the I/O lines 14 and 15 on the chip surface of the semiconductor device is such that the I/O lines interconnected by the I/O switches 13 are disposed along common straight lines. In this connection, it should be noted that FIG. 2 shows not only the interconnection of the I/O lines but also the layout of the I/O lines on the chip surface.

Four preamplifiers 10 are connected to the four pairs of the I/O lines 15 and are used for reading in the normal mode as well as in the test mode. Four test preamplifiers 11 are connected to the four pairs of the I/O lines 14 and are used for reading in the test mode, but not in the normal mode. A write controller 12 provides a signal 12a which is set at "0" for writing and "1" for reading. The signal 12a is input to a NAND gate 17, which also receives a signal 4a from a test controller 4. The signal 4a is at "1" during test mode and "0" during normal mode. The output 17a of the NAND gate 17, which is at "0" during reading in the test mode, and is at "1" during writing in the test mode and during reading and writing in the normal mode. Accordingly, the I/O switches 13 are conductive except during reading in the test mode. An exclusive-OR buffer 16 is connected to receive 8 bits of data, i.e., four bits from the test preamplifiers 11, and the other four bits from the preamplifiers 10 via the mode controller 3, and produces an output of "1" when all the inputs are identical, i.e., all "1" or all "0".

Row decoders 18 and 19 cooperate to select rows in the sections 8 and 9 during reading and writing in the normal mode. For instance, in the normal mode, the MSB of the row address code is used to select one of the sections 8 and 9. Memory cells one each of the four blocks of the selected section are selected by the rest of the address code, and one of the four memory cells is selected by the block selector 5 by selection of one of the I/O lines. In the test mode, the MSB of the row address code is not used for the selection of one of the sections 8 and 9. (It can therefore be used for other purposes.) Accordingly, memory cells one each of the four blocks of each of the sections are selected by the above-mentioned "rest of the address code", and the data are simultaneously read out of or written in eight memory cells.

Figure 2:
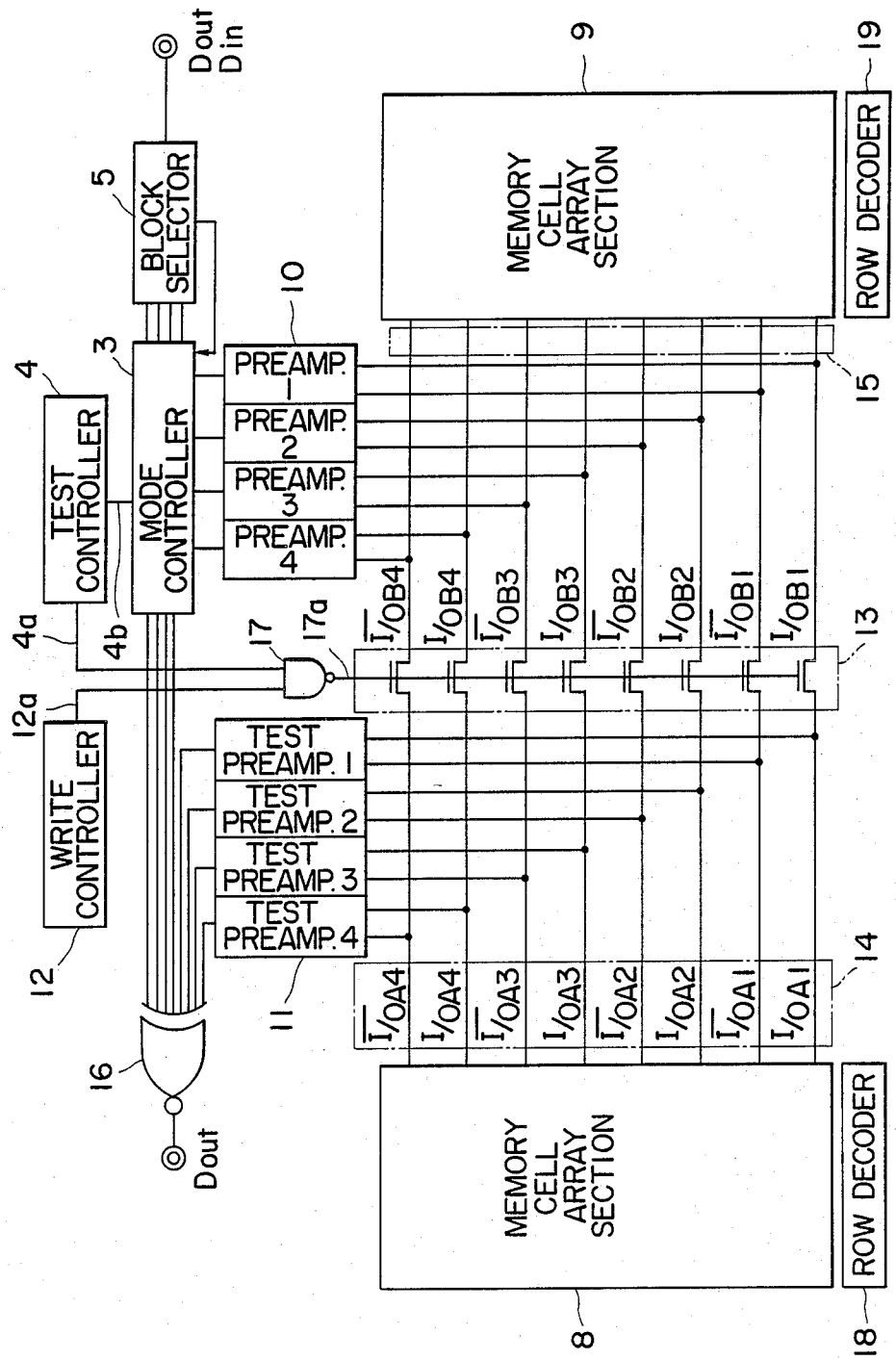
FIG. 2 is a block diagram showing a random access memory of an embodiment of the invention.

The embodiment shown in FIG. 2 has the configuration of four pairs of I/O lines and the mode controller 3 which are identical to those of the ×4 configuration shown in FIG. 1, but can read and write 8 bits of data simultaneously in the test mode.

The operation will now be described.

During reading in the normal mode, the I/O switches 13 are on. When the first section 8 is accessed, four bits of data are read out onto the four pairs of I/O lines 14. The control signals 17a to the I/O switches 13 are at "1", under control by the write controller 12 and test controller 4, so that the I/O switches 13 are conductive and the I/O lines 14 and 15 are respectively interconnected. As a result, the data on the I/O lines 14 are transmitted to the I/O lines 15. The preamplifiers 10 amplifies the data and the mode controller 3 and the block selector 5 select one of the four bits of data, which is output via the terminal Dout.

During writing in the normal mode, when one bit of data is to be written in the first section 8, the data is input via the terminal Din, the block selector 5 and the mode controller 3, by which the data is transmitted to only one of the pairs of the I/O lines 15, and is transmitted further to one of the pairs of the I/O lines 14 through the I/O switches 13 now being closed. Thus, the data is written in the first section 8.

For writing data in the second section 9, the data input via the terminal Din is transmitted to one of the pairs of the I/O lines 15 and is written in the second section 9.

The operations during reading in the test mode are as follows: The I/O switches 13 are then open under control of the test controller 4 and the write controller 13.

Data are read out of the the first section 8 and onto the four pairs of I/O lines 14, and are amplified by the four test preamplifiers 11, whose outputs are input to an exclusive-OR buffer 16. Simultaneously with the reading of data from the first section 8, data are also read out of the second section 9 onto the four pairs of I/O lines 15, and are amplified by the four preamplifiers 10, whose outputs are input to the exclusive-OR buffer 16. The exclusive-OR buffer 16 produces an output "1" when all the eight inputs are identical, i.e., all "1" or all "0". In advance of the data reading in the test mode, the same data are written into the eight memory cells, designated by the same address code except the MSB, from which the data are read out simultaneously during the subsequent reading. If all the data as input to the exclusive-OR buffer 16 are identical and its output is "1", it is judged that the memory operation is correct.

During writing in the test mode, the I/O switches 13 are under control of the test controller 4 and the write controller 12. The data input via the terminal Din are transmitted to the four pairs of I/O lines 15 and are written into the section 9. The data are also transfereed to the I/O lines 14 and are written in the first section 8. Thus, the data are simultaneously written into eight memory cells or eight bits.

In other words, the memory device operates as a memory device of ×8 configuration, and the test time is reduced to ½.

Figure 3:
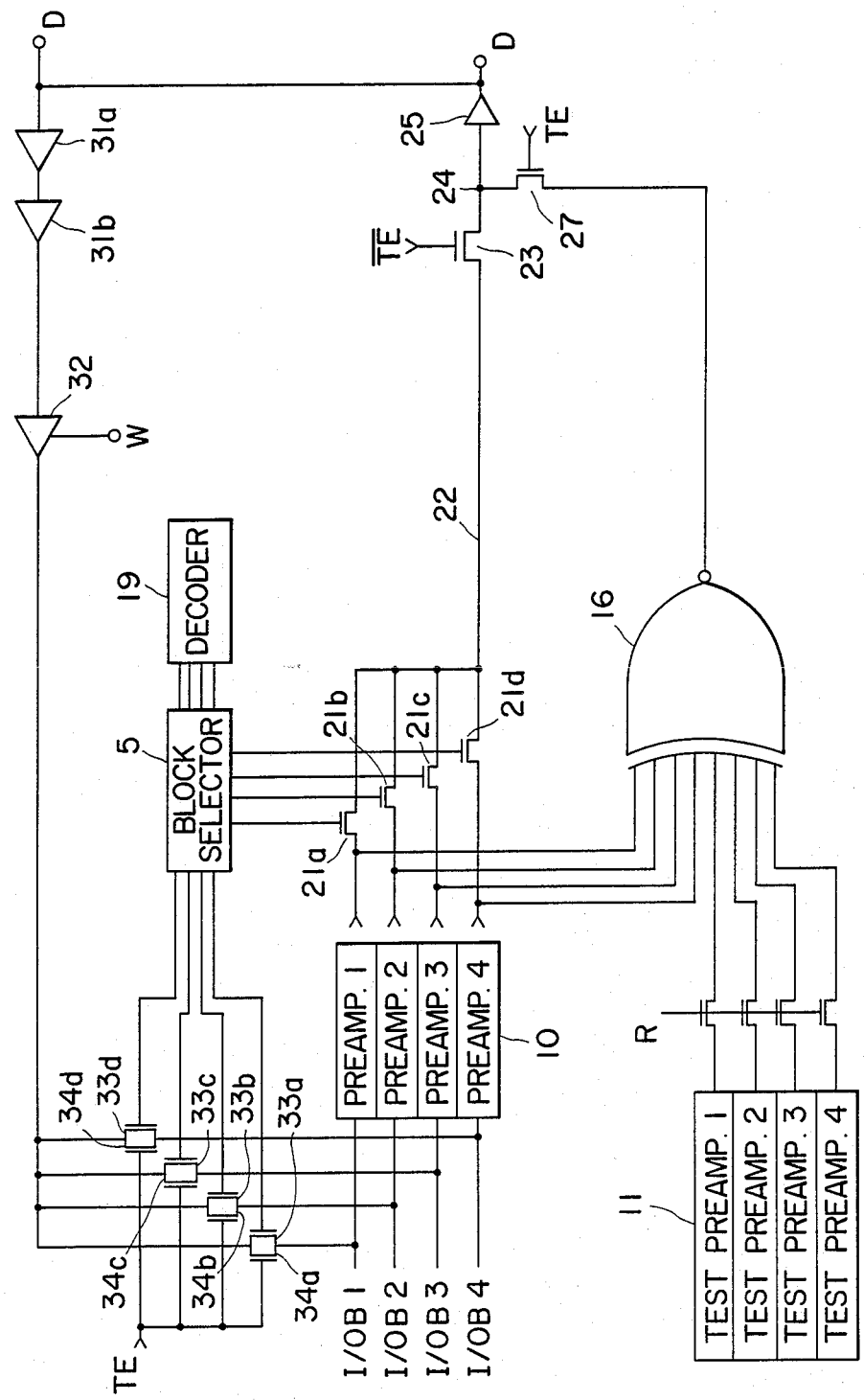
FIG. 3 is a block diagram showing a specific example of the mode controller.

FIG. 3 shows a specific example of the mode controller 3 with various circuit components connected thereto. The outputs of the preamplifiers 10 are connected to a node 22 through switches in the form of MOS transistors 21a to 21d, which are selectively made conductive by the block selector 5, which in turn is controlled by a decoder 19. The node 22 is connected to a node 24 through a switch in the form of MOS transistor 23, which is made conductive when a test control signal TE is at "1", i.e., in the normal mode. The node 24 is connected through an amplifier 25 to a terminal D.

During reading in the normal mode one of the MOS transistors 21a to 21d and the MOS transistor 23 are conductive, so that one of the outputs of the preamplifiers 10 is transmitted to and output through the terminal D.

The outputs of the preamplifiers 10 are also input to the exclusive-OR buffer 16. The outputs of the test preamplifiers 11 are also input to the exclusive OR buffer 16 through switches in the form of MOS transistors 26a to 26d which are made conductive when a read signal R from the write controller 12 is at "1" indicating that the reading (rather than writing) is to be performed.

During reading in the test mode, the outputs of the preamplifiers 10 and the test preamplifiers 11 are input to the exclusive-OR buffer 16. When all the inputs to the exclusive-OR buffer 16 are identical, i.e., all "1" or all "0", the output of the exclusive-OR buffer 16 is at "1". This output is passed through a switch in the form of MOS transistor 27, which is conductive during the test mode by virtue of a test control signal TE from the test controller 4 which is at "1" in the test mode, and through the amplifier 25 to the terminal D.

Input buffers 31a, 31b and 32, and MOS transistors 33a to 33d, 34a to 34d are provided for writing. The buffer 32 is activated only during writing by a write control signal W from the write controller 12.

In the normal mode, one of the four MOS transistors 33a to 33d is selected and made conductive. The data input through the terminal D is therefore passed through the MOS transistor being conductive to the I/O line connected to the conducting MOS transistor.

In the test mode, all the four transistors 34a to 34d are conductive by virtue of the test control signal TE. The input data is therefore transmitted to all the four I/O lines I/O B1 to I/O B4.

Although not illustrated, complementary signals are also supplied to complementary I/O lines I/O B1 to I/O B2.

Figure 4:
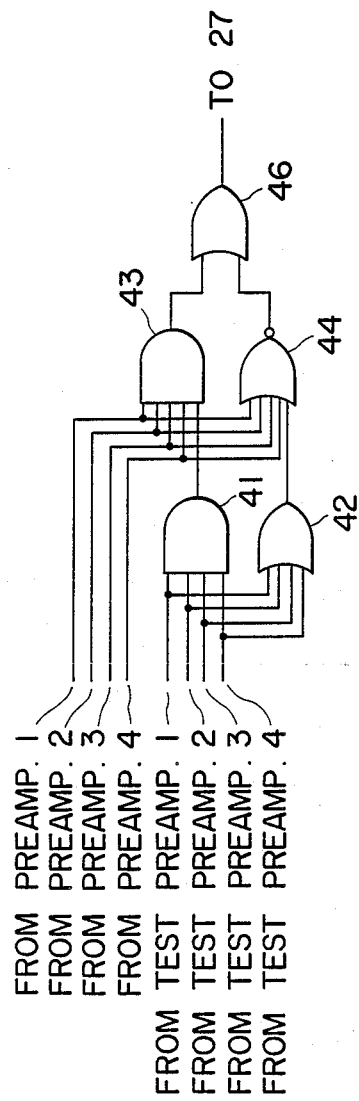
FIG. 4 is a block diagram showing an example of exclusive-OR gate.

FIG. 4 shows an example of configuration of the exclusive-OR buffer. As illustrated, it comprises an AND gates 41 and an OR gate 42 receiving four bits from the test preamplifiers 11, an AND gate 43 and a NOR gate 44 receiving four bits from the preamplifiers 10 as well as the outputs of the AND gate 41 and the OR gate 42, respectively. The output of the AND gate 43 is at "1" when all the outputs of the preamplifiers 10 and the test preamplifiers 11 are at "1". The output of the NOR gate 44 is at "1" when all the outputs of the preamplifiers 10 and the test preamplifiers 11 are at "0". The outputs of the AND gate 43 and the NOR gate 44 are input to an OR gate whose output is at "1" when the inputs to the exclusive-OR buffer are all "1" or all "0", i.e., identical to each other.

The embodiment described above is of the ×1 configuration, has four pairs of I/O line and operates as ×8 configuration in the test mode. But the invention is not limited to the specific configuration with respect to the number of blocks, the number of I/O lines and the number of sections.

As has been described according to the invention, the test time can be reduced without increasing the number of I/O line disposed in parallel with each other and without increasing the configuration of I/O lines.

What is claimed is:

1. A semiconductor memory device operable for reading and writing in a normal mode and in a test mode comprising, two memory cell sections each having an identical number of blocks in the memory cell sections,
   data bus lines connected to respective ones of the blocks,
   switch means for interconnecting data bus lines connected to blocks of different ones of the memory cell sections comprising switches associated with each of the data bus lines connected to the plurality of memory cell sections, the switches being configured so as to connect each other to the data bus lines connected to each of the memory cell sections,
   switch control means for causing the switch means to be conductive during reading and writing in the normal mode and during writing in the test mode, and causing the switch means to be nonconductive during reading in the test mode,
   first output means connected to the data bus lines that are connected to the blocks of one of the memory cell sections for applying input data onto the data bus lines for writing in the blocks of the section simultaneously during writing in the normal mode and in the test mode, and for outputting the data read out of the blocks of the sections during reading in the normal mode, and for outputting the data read out of the blocks of said one of the sections during reading in the test mode, and
   second output means connected to the data bus lines that are connected to the blocks of at least one of the memory cell sections other than said one of the memory cell sections, for outputting the data read out of the memory cell blocks of the at least one of the memory cell sections during the reading in the test mode.

2. A device according to claim 1, wherein there are four blocks of memory cells in each section, and four pairs of data lines respectively connected to the four blocks, and the switch means comprises four pairs of switches interconnecting the four pairs of data lines that are connected to the blocks of one of the sections and the four pairs of data lines that are connected to the blocks of the other sections.

3. A device according to claim 1, wherein the layout of the data bus lines on the chip surface is such that the data bus lines interconnected by the switch means are disposed along common lines.

4. A device according to claim 3, wherein the data bus lines connected to the same section are disposed in parallel with each other on the chip surface.

5. A device according to claim 1, further comprising means for comparing, for the purpose of testing, the data output by said means connected to the data lines, in the test mode.

6. A device according to claim 1, further comprising decoder means for selecting one of the sections during reading and writing in the normal mode.

7. A semiconductor memory device operable for reading and writing in a normal mode and in a test mode comprising,
   two memory cell sections each having blocks of memory cells, wherein said two memory cell sections comprise first and second memory cell sections,
   data bus lines connected to respective ones of the blocks,
   switch means for interconnecting data bus lines connected to blocks of different ones of the memory cell sections,
   switch control means for causing the switch means to be conductive during reading and writing in the normal mode and during writing in the test mode, and causing the switch means to be nonconductive during reading in the test mode,
   first output means connected to the data bus lines that are connected to the blocks of one of the memory cell sections for applying input data onto the data bus lines for writing in the blocks of the section simultaneously during writing in the normal mode and in the test mode, and for outputting the data read out of the blocks of the sections during reading in the normal mode, and for outputting the data read out of the blocks of said one of the sections during reading in the test mode, first output means further comprises a plurality of preamplifier means, coupled with the data bus lines connected to the first memory cell section, for amplifying the data read out of the blocks of all the memory cell sections in the normal mode and amplifying the data read out of the blocks of said one of the memory cell sections in the test mode, and second output means connected to the data bus lines that are connected to the blocks of at least one of the memory cell sections other than said one of the memory cell sections, for outputting the data read out of the memory cell blocks of the at least one of the memory cell sections during the reading in the test mode, and said second output means further comprises a plurality of test preamplifier means coupled with the data bus lines connected to the second memory cell section for amplifying the data read out of the blocks of the second section.

8. A device according to claim 7, further comprising means for receiving the outputs of the plurality of preamplifier means and the plurality of test preamplifier means and checking whether all of the outputs agree with each other.

9. A device according to claim 7, further comprising an address decoder for selecting one of the blocks during writing and reading in the normal mode.

* * * * *

UNITED STATES PATENT AND TRADEMARK OFFICE
CERTIFICATE OF CORRECTION

PATENT NO. : 4,873,669
DATED : October 10, 1989
INVENTOR(S) : Furutani, et al

It is certified that error appears in the above-indentified patent and that said Letters Patent is hereby corrected as shown below:

Column 1, line 21, replace "are" with --is--;

line 44, replace "exclusive-OR" with --exclusive-NOR--; and line 65, replace "exclusive-OR" with -- exclusive-NOR--.

Column 2, line 67, replace "exclusive-OR" with -- exclusive-NOR--.

Column 3, line 30, replace "gate 17," with --gate 17--;

line 31, delete "which"; and line 35, replace "exclusive-OR" with --exclusive-NOR--.

Column 4, line 21, replace "13" with --12--;

line 25, replace "exclusive-OR" with --exclusive-NOR--;

line 29, replace "exclusive-OR" with --exclusive-NOR--;

line 30, replace "exclusive-OR" with --exclusive-NOR--;

line 36, replace "exclusive-OR" with --exclusive-NOR--;

line 40, between the words "are" and "under" insert --conductive--;

line 44, replace "in the" with --into--;

line 67, replace "exclusive-OR" with --exclusive-NOR--; and line 68, replace "exclusive OR" with --exclusive-NOR--.

UNITED STATES PATENT AND TRADEMARK OFFICE
CERTIFICATE OF CORRECTION

PATENT NO. : 4,873,669

DATED : October 10, 1989

INVENTOR(S) : Furutani, et al

It is certified that error appears in the above-indentified patent and that said Letters Patent is hereby corrected as shown below:

Column 5, line 8, replace "exclusive-OR" with --exclusive-NOR--;

line 9, replace "exclusive-OR" with --exclusive-NOR--; and line 10, replace "exclusive-OR" with --exclusive-NOR--.

Signed and Sealed this

Sixteenth Day of November, 1993

Attest:

BRUCE LEHMAN

*Attesting Officer*  *Commissioner of Patents and Trademarks*